(12) United States Patent
Song et al.

(10) Patent No.: US 7,974,539 B2
(45) Date of Patent: Jul. 5, 2011

(54) BI-DIRECTIONAL OPTICAL MODULE

(75) Inventors: Jung Ho Song, Daejeon (KR); Yong Soon Baek, Daejeon (KR); Sung Il Kim, Daejeon (KR); Ki Soo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 703 days.

(21) Appl. No.: 11/994,325

(22) PCT Filed: Jul. 21, 2006

(86) PCT No.: PCT/KR2006/002875
§ 371 (c)(1),
(2), (4) Date: Dec. 28, 2007

(87) PCT Pub. No.: WO2007/029920
PCT Pub. Date: Mar. 15, 2007

(65) Prior Publication Data
US 2008/0212973 A1  Sep. 4, 2008

(30) Foreign Application Priority Data
Jul. 26, 2005 (KR) .................. 10-2005-0067820
Dec. 15, 2005 (KR) .................. 10-2005-0124043

(51) Int. Cl.
*H04B 10/00* (2006.01)

(52) U.S. Cl. .................. 398/138; 398/135; 398/164

(58) Field of Classification Search .................. 398/33, 398/135, 137, 138, 164, 195, 197
See application file for complete search history.

(56) References Cited

U.S. PATENT DOCUMENTS

| 5,127,075 A * | 6/1992 | Althaus et al. .................. 385/94 |
| 6,721,511 B1 * | 4/2004 | Tatsuno et al. .................. 398/141 |
| 2006/0093287 A1 * | 5/2006 | Yoshikawa et al. ............. 385/92 |
| 2007/0122154 A1 * | 5/2007 | Nakanishi et al. .............. 398/85 |

FOREIGN PATENT DOCUMENTS

| EP | 892511 A2 * | 1/1999 |
| JP | 2000-304985 | 11/2000 |
| WO | WO-2005/010588 | 2/2005 |

OTHER PUBLICATIONS

Mallécot et al., −31 dBm Sensitivity of A Monolithic Transmit-Receive-Device Over Wide Temperature Range, Optical Fiber Communication Conference 1999, vol. 3, pp. ThN2-1/191-ThN2-4/194, Feb. 21-26, 1999.
Yoon et al., Compact Bidirectional Optical Module Using Ceramic Blocks, IEEE Photonics Technology Letters, vol. 16, No. 8, Aug. 2004, pp. 1954-1956.

* cited by examiner

*Primary Examiner* — Dalzid Singh
(74) *Attorney, Agent, or Firm* — Rabin & Berdo, P.C.

(57) ABSTRACT

Provided is a bi-directional optical module including: a transmission optical element including an SOA (semiconductor optical amplifier) aligned on an optical axis of an LD (laser diode) formed on a substrate; and a reception optical element comprising a PD (photodiode) including a light receiving surface perpendicular to the optical axis of the LD of the transmission optical element.

18 Claims, 9 Drawing Sheets

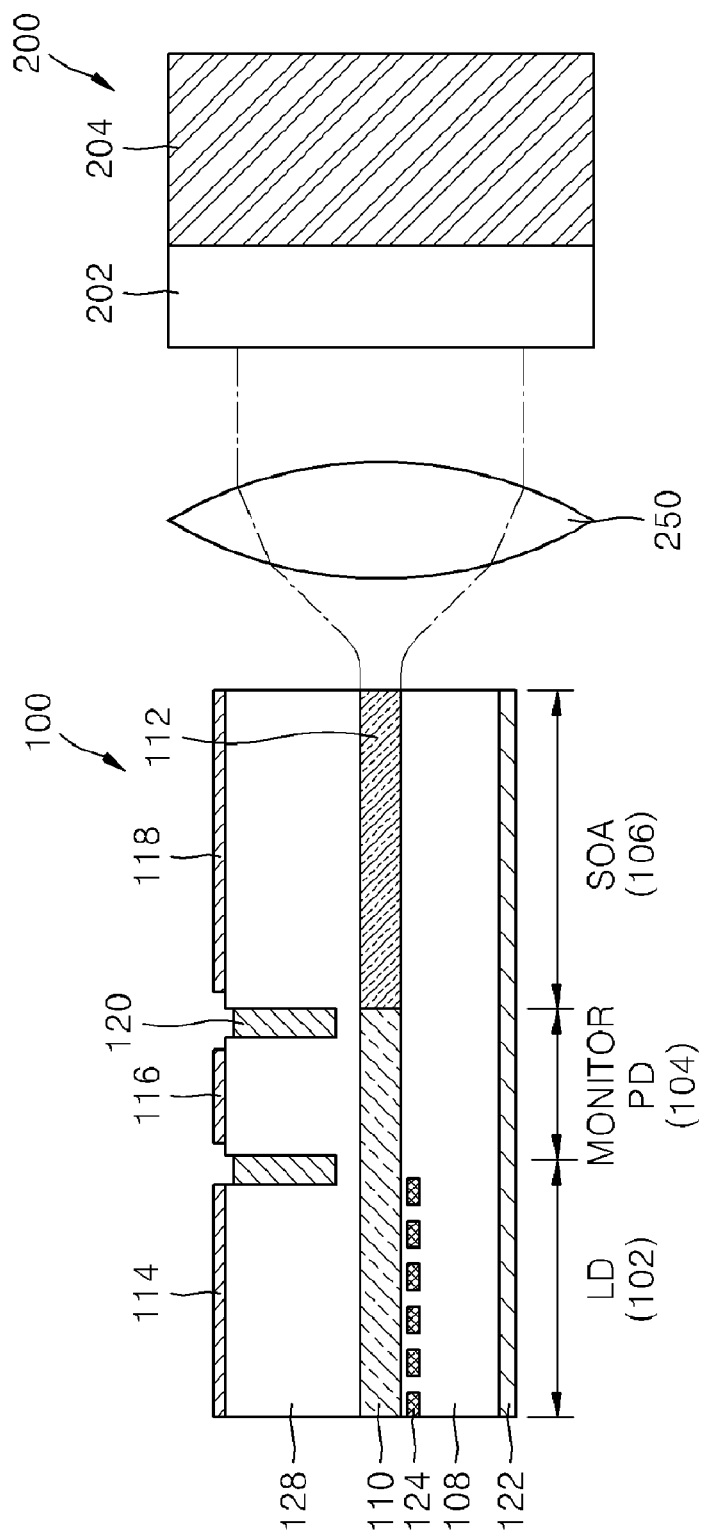

BI-DIRECTIONAL OPTICAL MODULE

CROSS-REFERENCE TO RELATED PATENT APPLICATION

This application claims the benefit of Korean Patent Application Nos. 10-2005-0067820, filed on Jul. 26, 2005, and 10-2005-0124043, filed on Dec. 15, 2005, in the Korean Intellectual Property Office, the disclosures of which are incorporated herein in their entirety by reference.

BACKGROUND OF THE INVENTION

1. Field of the Invention

The present invention relates to an optical module, and more particularly, to a bi-directional optical module simultaneously transmitting and receiving optical signals having different wavelengths through a single optical fiber.

2. Description of the Related Art

In general, an individual subscriber transmits and receives an optical signal through a strand of optical fiber on a network such as an optical subscriber network. Such a single optical fiber distribution network can reduce cost for installing an optical fiber. Thus, a communication network can be built at a low cost. Two wavelengths are used to transmit and receive an optical signal. In general, a wavelength of 1.3 μm is used to transmit the optical signal, and a wavelength of 1.5 μm is used to receive the optical signal. A bi-directional optical module is used to simultaneously transmit and receive optical signals having different wavelengths using a single optical fiber.

FIG. 1 is a schematic cross-sectional view of a bi-directional optical module according to the prior art.

In detail, FIG. 1 is a schematic cross-sectional view of a bi-directional optical module disclosed on Jun. 30, 1992 in U.S. Pat. No. 5,127,075 invented by Althaus et al. Referring to FIG. 1, the bi-directional optical module includes a transistor outline (TO) type laser diode (LD) module 10, a TO type photo diode (PD) module 20, and a wavelength division multiplexing (WDM) filter 30. The TO type LD module 10 includes an LD 12, a monitor PD 14, a lens 16, and an LD cap 18. The monitor PD 14 is used to monitor light having a wavelength of 1.3 μm, the light being output from the LD 12.

The TO type PD module 20 includes a PD 22, a lens 24, and a PD cap 26. The TO type LD module 10 and the TO type PD module 20 are connected to each other through a common housing 34. The WDM filter 30 reflects light having a wavelength of 1.5 μm, the light being incident from an optical fiber 32, and being received in the TO type PD module 20 as marked with chain lines and transmits light having a wavelength 1.3 μm, the light being output from the TO type LD module 10, through a lens 28 and the optical fiber 32. In other words, the WDM filter 30 spatially splits the light having the wavelengths of 1.3 μm and 1.5 μm.

However, in the bi-directional optical module shown in FIG. 1, the common housing 34 must be highly precisely manufactured. Also, in the bi-directional optical module shown in FIG. 1, the TO type LD module 10 and the TO type PD module 20 must be separately manufactured and then attached to the common housing 34. Thus, manufacturing of the bi-directional optical module is costly.

Structures of a general TO type LD module and the TO type LD module 10 shown in FIG. 1 will now be described in more detail.

FIGS. 2 through 4 are front and side cross-sectional views and a plan view of a general TO type LD module.

In detail, a TO type LD module 50 shown in FIGS. 2 through 4 uses a TO type package. In a basic structure of the TO type package, a sub-mount pedestal 54 is vertically attached to a circular header base 52. The circular header base 52 encloses a cylindrical cap 64, and a window 66 is formed in a center of the cylindrical cap 64 so as to pass light. A lead pin 62 protruding outside is attached to the circular header base 52.

An LD 56 constituting the TO type LD module 50 is attached to a sub-mount 58 and then to a sub-mount pedestal 54, and a monitor PD 60 is attached to the circular header base 52 through the sub-mount 58. The LD 56 and the monitor PD 60 are electrically connected to the lead pin 62. The lead pin 62 is connected to the LD 56 and the monitor PD 60 through wires 68 using wire bonding.

The LD 56 outputs light toward a window 66 and the circular header base 52. The light being output toward the window 66 is combined with an optical fiber (not shown) through a lens, and the light being output toward the circular header base 52 is detected as a signal by the monitor PD 60 so as to monitor an output of the LD 56.

The TO type package adopted in the TO type LD modules 10 and 50 shown in FIGS. 1 through 4 remarkably succeeds in terms of industry and is used in a compact disc player, a laser pointer, a bar-code scanner, or the like. Such a TO type package can be produced at a considerably low cost, and light power coincides with a central axis of the circular header base 52 so as to be easily arranged with and fixed to an optical system such as an optical fiber or the like. The TO type package can be intercepted from the outside by the window 66 and a cap 64 so as to protect the LDs 12 and 56 that may be damaged by moisture or the like. The attachment of an optical fiber to the TO type package with good light coupling is an established process and thus can be achieved at a low cost.

A bi-directional optical module including a single TO type package has been suggested to use the advantages of such a TO type package. An example of such a bi-directional optical module includes U.S. Pat. No. 6,493,121, entitled "Bi-directional Module for Multi-channel Use" by Althaus et al. on Dec. 10, 2002. Also, such a bi-directional optical module has been described in "Compact Bi-directional Optical Module Using Ceramic Blocks" by H.-J. Yoon, "IEEE Photonics Technology Letters, Vol. 16, No. 8, 2004, pp. 1954-1956." However, in such a bi-directional optical module, a TO type package requires many parts that need to be precisely processed. Thus, cost for manufacturing the bi-directional optical module is increased.

FIG. 5 is a schematic cross-sectional view of a bi-directional device according to the prior art.

In detail, FIG. 5 illustrates a disclosure, entitled "−31 dBm Sensitivity of a Monolithic Transmit-receive Device over Wide Temperature Range" by Mallecot et al. in "Optical Fiber Communication Conference 1999 Technical Digest, Vol. 3, pp. 191-194." A bi-directional device 70 shown in FIG. 5 is manufactured by integrating an LD 72, an absorber 74 attenuating light output from the LD 72 toward a PD 76, and the PD 76 detecting light into a single chip. The LD 72 includes an active layer 82 generating light having a wavelength of 1.3 μm inside a substrate 78, and the PD 76 includes the active layer 82 detecting light having a wavelength of 1.5 μm inside the substrate 78. As shown in FIG. 5, reference numeral 84 denotes a grating constituting the LD 72, reference numeral 86 denotes an LD electrode, reference numeral 88 denotes an absorber electrode, reference numeral 90 denotes a PD electrode, reference numeral 94 denotes a common electrode, and reference numeral 92 denotes an electrical isolation layer.

However, sensitivity of −31 dBm was obtained at an optical transmission speed of 155 Mbit/s in the bi-directional device adopting the structure shown in FIG. 5, and PD responsivity was 0.3 A/W. In general, sensitivity of a receiver is expressed as in Equation 1:

$$\text{Sensitivity} = 10 \log(\text{SN} \cdot \ln(re+1) \cdot 1000)/(2\rho \cdot (re-1))\text{dBm} \quad (1)$$

wherein SN denotes a signal-to-noise ratio, re denotes an extinction ratio, In denotes a noise current A of a transimpedance amplifier (TIA) connected to a PD, and ρ denotes module responsivity. In a case where the TIA is formed of a field effect transistor (FET), a noise current increases in the form of square root with an increase in a bandwidth. When an optical transmission speed is 1.25 Gbit/s, responsivity of the PD 76 must be 0.85 A/W to get the same sensitivity. It is very difficult to obtain high PD responsivity with the bi-directional device as shown in FIG. 5 because of reasons described in the following paragraph. Thus, high module receive sensitivity cannot be obtained.

In the bi-directional device shown in FIG. 5, an optical signal incoming to the PD 76 is coupled from an optical fiber (not shown) to the LD 72 and propagated through the LD 72, the optical signal having a wavelength of 1.5 μm. Optical coupling efficiency between the LD 72 and the optical fiber is lower than that between the typical surface incidence type PD and the optical fiber. Highly doping of impurities on a p-clad layer for a high temperature operation of the LD 72 increases loss of an optical signal caused by intervalence band absorption. An absorbing waveguide may be inserted between the LD 72 and PD 76 to prevent an optical crosstalk of the PD 76 caused by an optical signal output from the LD 72, the optical signal having a wavelength of 1.3 μm. The absorbing waveguide causes loss of an optical signal. Thus, the optical signal being input toward the PD 76, the optical signal having the wavelength of 1.5 μm, becomes weak due to the losses caused by the optical coupling and the waveguide, and thus responsivity of the PD 76 is lowered.

In addition, the bi-directional device shown in FIG. 5 has a single chip form into which an LD, an absorber, and a PD are integrated. Thus, the LD requires a forward voltage, while the PD requires a reverse voltage. As a result, two power supplies are required. Moreover, in the bi-directional device shown in FIG. 5, the LD, the absorber, and the PD are placed on a substrate. Thus, an electrical crosstalk between the LD and the PD is very large at a high transmission speed.

SUMMARY OF THE INVENTION

The present invention provides a single bi-directional optical module in which a TO type LD module and a TO type PD module are not separately manufactured so as to reduce manufacturing cost.

The present invention also provides a bi-directional optical module adopting a single TO type package including a smaller number of parts needing to be precisely processed at a low cost.

The present invention also provides a bi-directional optical module improving sensitivity of a reception optical element, i.e., a PD.

According to an aspect of the present invention, there is provided a bi-directional optical module simultaneously transmitting and receiving optical signals having different wavelengths, including: a transmission optical element comprises an LD (laser diode) and an SOA (semiconductor optical amplifier) which is aligned on an optical axis of the LD, integrally formed each other on a substrate; and a reception optical element including a PD (photodiode) comprising a light receiving surface perpendicular to the optical axis of the LD of the transmission optical element.

The bi-directional optical module may further include a monitor PD integrated and aligned on the optical axis of the LD formed on the substrate. The PD of the reception optical element may be a surface incidence type PD, and an optical BPF (band pass filter) may be formed on a light receiving surface of the surface incidence type PD. The PD of the transmission optical element may be optically coupled to the optical axis of the LD of the reception optical element through a free space propagation or a lens.

According to another aspect of the present invention, there is provided a bi-directional optical module simultaneously transmitting and receiving optical signals having different wavelengths, including: a transmission optical element comprises an LD, a monitor PD and an SOA which are aligned on an optical axis of the LD, integrally formed each other on a substrate; and a reception optical element including a PD including a light receiving surface perpendicular to the optical axis of the LD of the transmission optical element and an optical BPF attached to the light receiving surface of the PD.

A bi-direction optical module simultaneously transmitting and receiving optical signals having different wavelengths using transmission and reception optical elements, including: the transmission optical element attached to a sub-mount of a TO package including a sub-mount pedestal perpendicularly attached to a header base and the sub-mounted positioned inside the sub-mount pedestal; and the reception optical element attached to the header base of the TO type package and comprising a reception surface perpendicular to an optical axis of the transmission optical element. The transmission optical element includes an LD (laser diode) and an SOA (semiconductor optical amplifier) which is aligned on an optical axis of the LD, integrally formed each other on a substrate. The transmission optical element may further include a monitor PD integrated and aligned on the optical axis.

BRIEF DESCRIPTION OF THE DRAWINGS

The above and other features and advantages of the present invention will become more apparent by describing in detail exemplary embodiments thereof with reference to the attached drawings in which:

FIGS. 6A and 6B are cross-sectional views illustrating optical coupling of a bi-directional optical module according to an embodiment of the present invention;

DETAILED DESCRIPTION OF THE INVENTION

Figure 1:
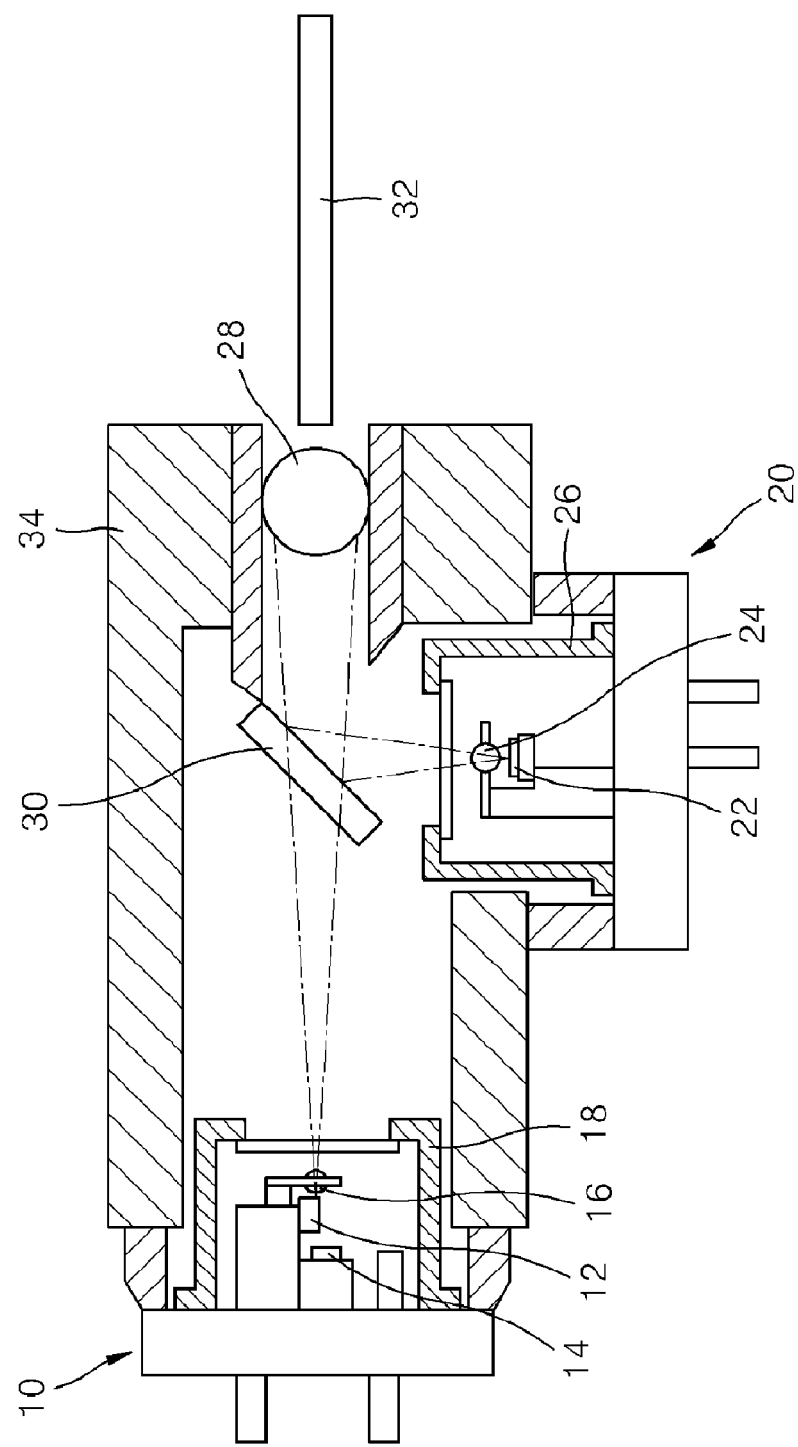
FIG. 1 is a schematic cross-sectional view of a bi-directional optical module according to the prior art.
Figure 2:
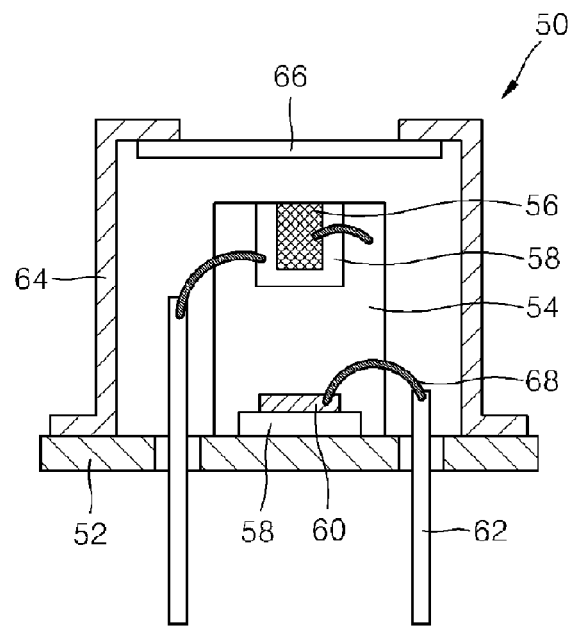
FIGS. 2 through 4 are front and side cross-sectional views and a plan view of a general TO type LD module.
Figure 3:
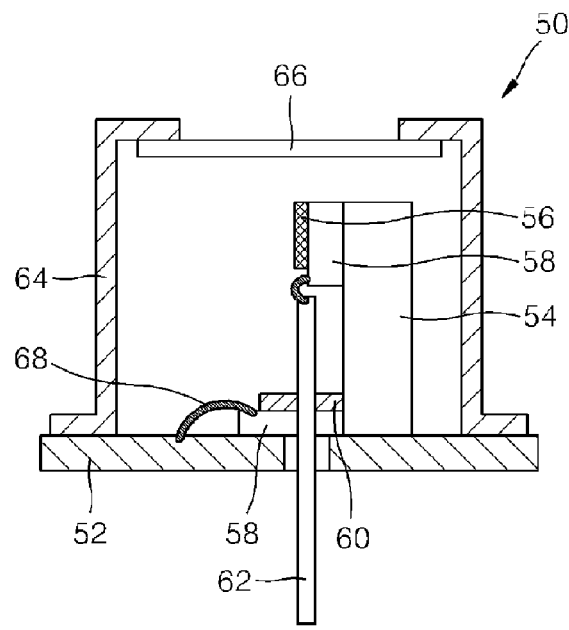
Figure 4:
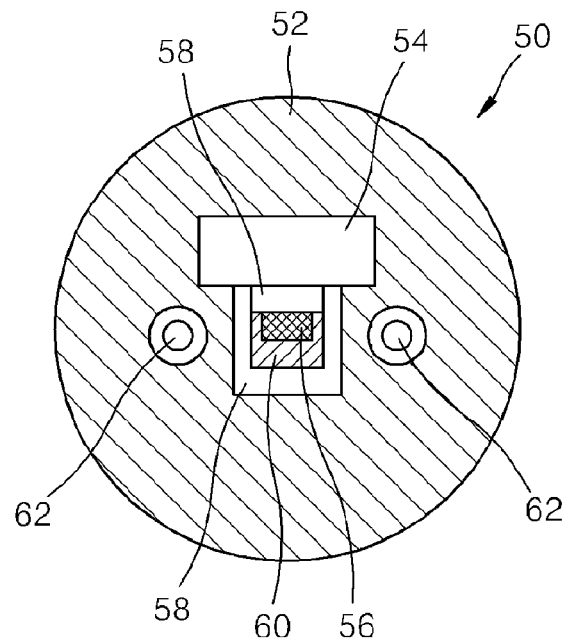
Figure 5:
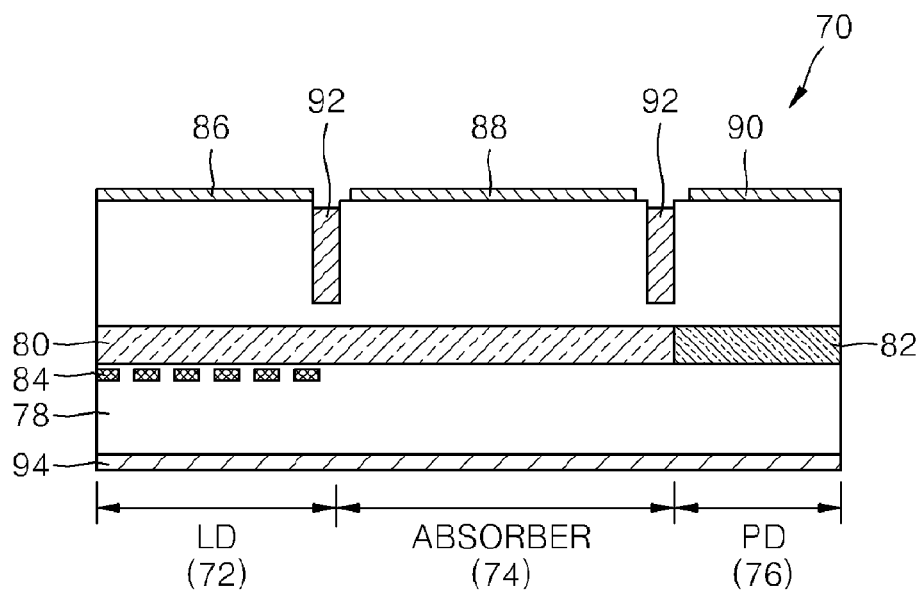
FIG. 5 is a schematic cross-sectional view of a bi-directional device according to the prior art.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 6A:
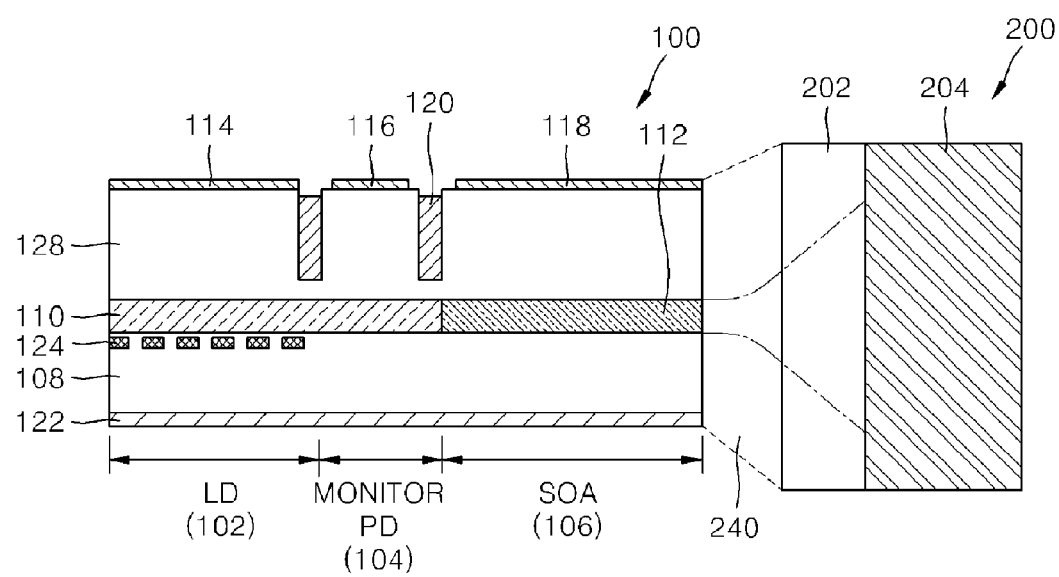

FIGS. 6A and 6B are cross-sectional views illustrating optical coupling of a bi-directional optical module according to an embodiment of the present invention.

A structure for coupling of a bi-directional optical module according to the present invention will be described. A bi-directional optical module according to the present invention includes a transmission optical element 100, which includes an LD 102 used for transmission, a monitor PD 104 monitoring light output from the LD 102, and a semiconductor optical amplifier (SOA) 106 integrally formed each other, on an InP substrate.

The transmission optical element 100 is arranged with respect to an optical axis of the LD 102 on a substrate 108 to integrate the monitor PD 104 and the SOA 106 thereinto. The SOA 106 is integrated to prevent a received optical signal from being weak due to optical coupling loss and waveguide loss. The LD 102, the monitor PD 104, and the SOA 106 are integrated into the transmission optical element 100. However, only the LD 102 and the SOA 106 may be integrated into the transmission optical element 100.

The bi-directional optical module according to the present invention includes a reception optical element 200 which includes an optical band pass filter (BPF) 202 transmitting only light having a wavelength of 1.5 μm and a PD 204 receiving light. The optical BPF 202 prevents sensitivity of the reception optical element 200 from being worsened due to a spontaneous emission output from the SOA 106. The optical BPF 202 is formed to a thickness about 20 μm by stacking a dielectric layer on the PD 204 or attaching a thin film filter formed on a polymer thin film as a substrate. The PD 204 may be a surface incidence type PD.

The LD 102 includes a grating 124 and may be a distributed feedback (DFB) LD. The LD 102 lases light having a wavelength of 1.3 μm into the substrate 108 and includes a first active layer 110 operating as an optical waveguide through which the lased light advances. The SOA 106 includes a second active layer 112 amplifying light having a wavelength of 1.5 μm and operating as an optical waveguide through which the amplified light advances. The first and second active layer 110 and 112 may be formed of InGaAsP or InGaAlAs. An upper clad layer 128 is formed on the first and second active layers 110 and 112. The upper clad layer 128 is formed of InP.

As shown in FIGS. 6A and 6B, reference numerals 114, 116, 118, 122, and 120 denote an LD anode, a monitor PD anode, an SOA anode, a common electrode, and an electrical isolation layer, respectively. The LD anode 114, the monitor PD anode 116, and the SOA anode 118 are electrically isolated from one another by the electrical isolation layer 120.

Optical coupling of the bi-directional optical module according to the present invention will now be described.

The LD 102 of the transmission optical element 100 transmits the light having the wavelength of 1.3 μm through an optical fiber (not shown) to the outside. In addition, the monitor PD 104 absorbs and monitors the light output from the LD 102. A band gap of the second active layer 112 of the SOA 106 is smaller than that of the first active layer 110 of the LD 102. Thus, a portion of the light of the wavelength of 1.3 μm that is not absorbed by the monitor PD 104 is absorbed by the SOA 106. A straight portion of the light of the wavelength of 1.3 μm that is not absorbed by the SOA 106 is reflected from the optical BPF 202 transmitting only the light having the wavelength of 1.5 μm. Thus, the light having the wavelength of 1.3 μm hardly advances toward the PD 204. As a result, an optical crosstalk from the LD 102 toward the PD 204 hardly occurs.

Also, an optical signal having a wavelength of 1.5 μm received from the outside is coupled from an optical fiber (not shown) to a waveguide (the first active layer 110) of the LD 102. The optical signal having the wavelength of 1.5 μm has light loss passing through the waveguide of the LD 102 and a waveguide (the first active layer 110) of the monitor PD 104 due to intervalence band absorption caused by p-doping and is amplified passing through a waveguide (the second active layer 112) of the SOA 106.

The optical signal amplified by the SOA 106 is radiated and propagated in a free space as marked with chain lines of FIG. 6A. When a spot size of the light amplified by the SOA 106 is 1 μm and advances 30 μm, the light has a beam diameter of about 60 μm. If a diameter of a light receiving surface of the PD 204 is about 80 μm, the receiving surface has an alignment tolerance of about 20 μm. In other words, the optical signal having the wavelength of 1.5 μm is amplified by the SOA 106 to compensate for loss of coupling with an optical fiber, waveguide loss, and loss of coupling with the PD 204 so as to increase an alignment tolerance and sensitivity of a reception optical element.

When a gap between the SOA 106 and the light receiving surface of the PD 204, for example, a gap between the SOA 106 and the optical BPF 202, is filled with an index matching material 240, the alignment tolerance is further increased. Also, the optical signal amplified by the SOA 106 can be coupled through a lens 250 as shown in FIG. 6B. In a case where optical coupling between the SOA 106 and the PD 204 is performed through the lens 250, the alignment tolerance can be further increased.

A method of manufacturing a transmission optical element constituting the bi-directional optical module according to the present invention will now be described.

Figure 7:
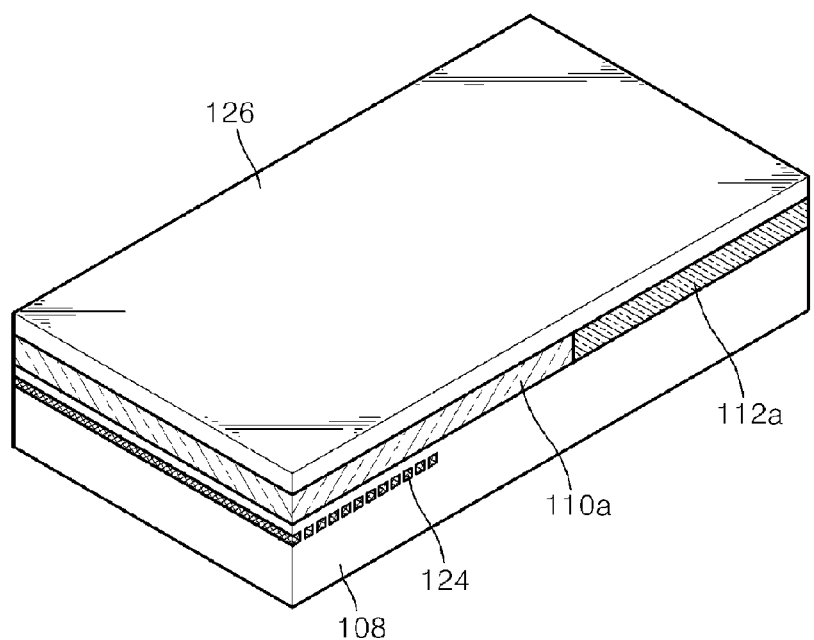
FIGS. 7 through 9 are perspective vies illustrating a method of manufacturing a transmitter optical device constituting a bi-directional optical module according to an embodiment of the present invention.
Figure 8:
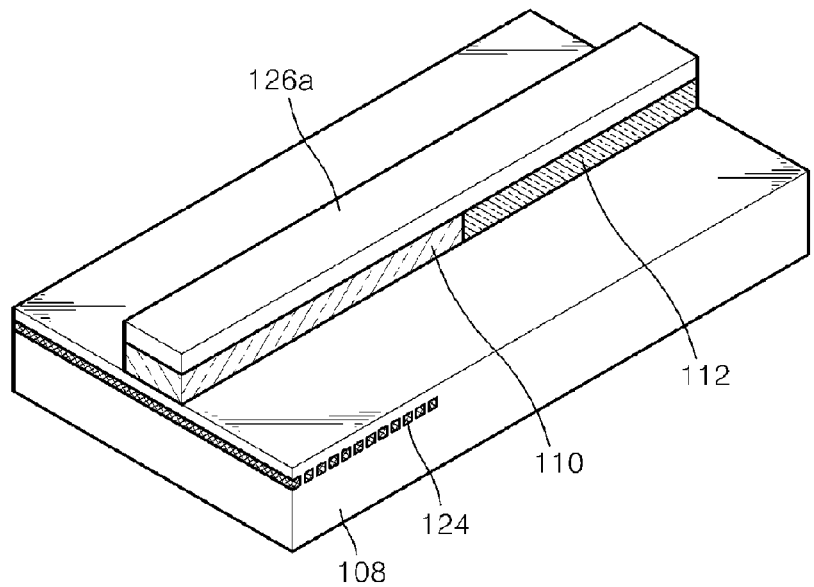
Figure 9:
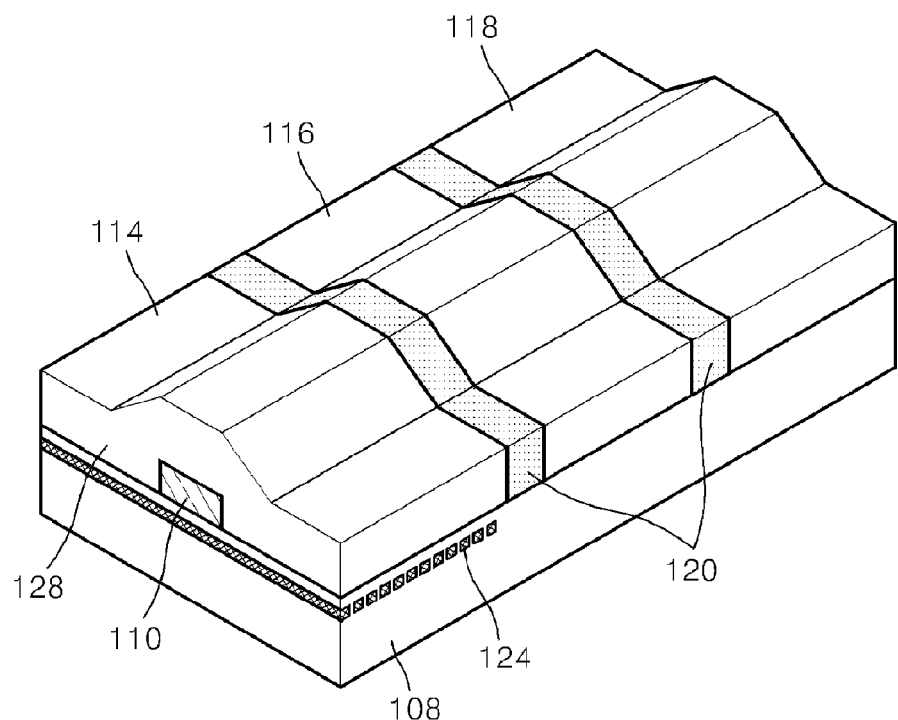

FIGS. 7 through 9 are perspective views illustrating a method of manufacturing a transmission optical element constituting a bi-directional optical module according to an embodiment of the present invention. The same reference numerals of FIGS. 7 through 9 as those of FIGS. 6A and 6B denote like elements.

Referring to FIG. 7, a lower clad layer (not shown) and a grating 124 are formed on a substrate 108, for example, an InP substrate, to manufacture an transmission optical element 100 into which an LD 102, a monitor PD 104, and an SOA 106 are integrated. A first material layer 110a to be used as a first active layer 110 and a first upper clad layer 126 are grown on the grating 124. The first material layer 110a and the first upper clad layer 126 in which the SOA 106 is to be positioned are etched, and a second material layer 112a to be used as a second active layer 112 and the first upper clad layer 126 are grown. The first and second material layers 110a and 112a to be respectively used as the first and second active layers 110 and 112 are formed of InGaAsP or InGaAlAs. The first upper clad layer 126 is formed of InP.

The first and second material layers 110a and 112a used as active layers in bands of 1.3 μm and 1.5 μm may be grown at a time using a selective area growth method besides a butt-joint of forming material layers used as active layers in the above.

Referring to FIG. 8, an etch mask material layer (not shown) such as silicon nitride is deposited on the first upper clad layer 126 and then patterned in a stripe shape. The first and second material layers 110a and 112a and the first upper clad layer 126 are etched using the etch mask material layer as an etch mask to form the first active layer 110 used layer as an optical waveguide of an LD, the second active layer 112 used as an optical waveguide of the SOA 106, and the first upper clod layer pattern 126a.

Referring to FIG. 9, a second upper clad layer 128 is formed on the entire surface of the substrate 108 on which the first and second active layers 110 and 112 and the first clad layer pattern 126a are formed. The second upper clad layer 128 is formed of InP. In FIG. 9, the first clad layer pattern 126a is omitted for clarity. An electrical isolation layer 120 is formed among the LD 102, the monitor PD 104, and the SOA 106 using ion implantation or etching.

A metal is deposited and patterned on the second upper clad layer 128 to form anodes 114, 116, and 118 of the LD 102, the monitor PD 104, and the SOA 106. A metal is deposited on a rear surface of the substrate 108 to form a common electrode 122 as shown in FIGS. 6A and 6B. As shown in FIG. 9, a buried waveguide is formed. However, a ridge type waveguide that does not need to be re-grown may be formed.

Figure 10:
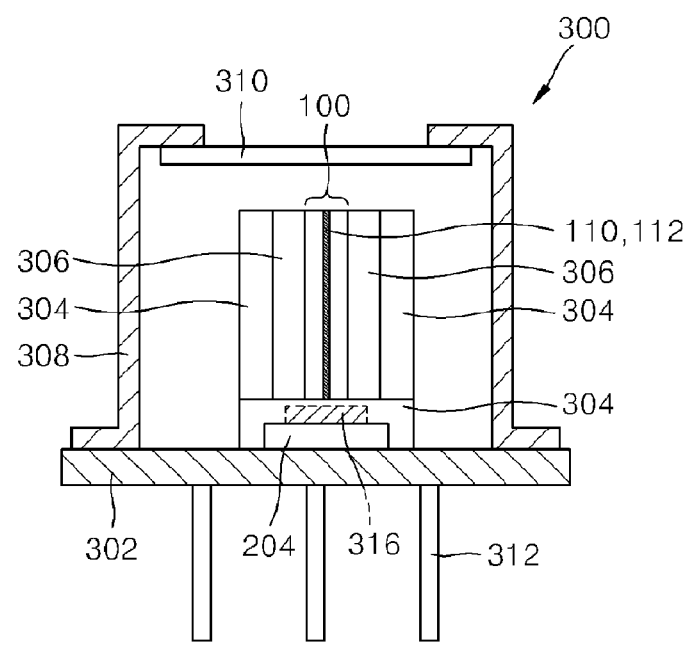
FIGS. 10 and 11 are front and side cross-sectional views of a bi-directional optical module according to an embodiment of the present invention.
Figure 11:
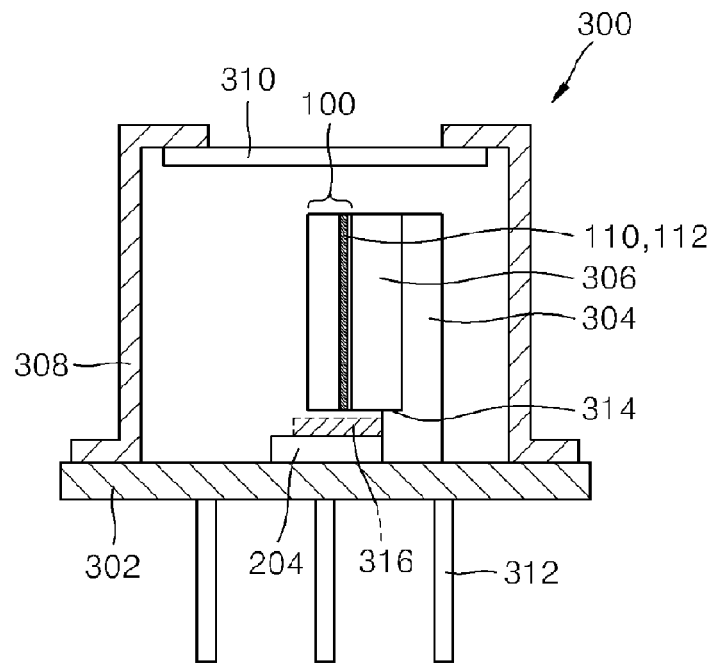
Figure 12:
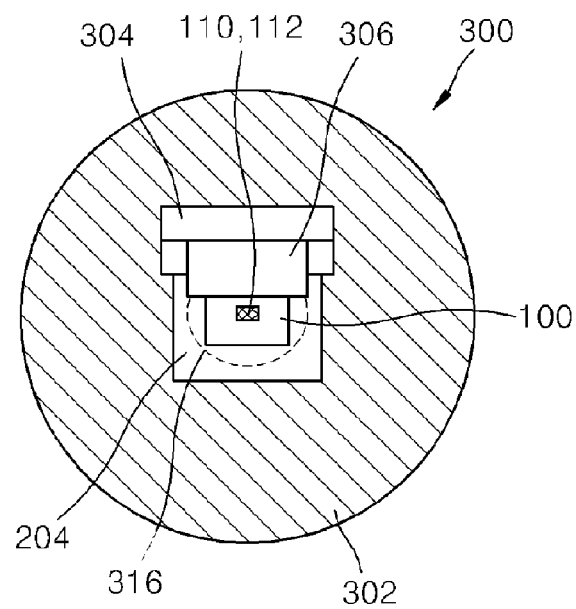
FIGS. 12 and 13 are plan views of a bi-directional optical module according to an embodiment of the present invention.
Figure 13:
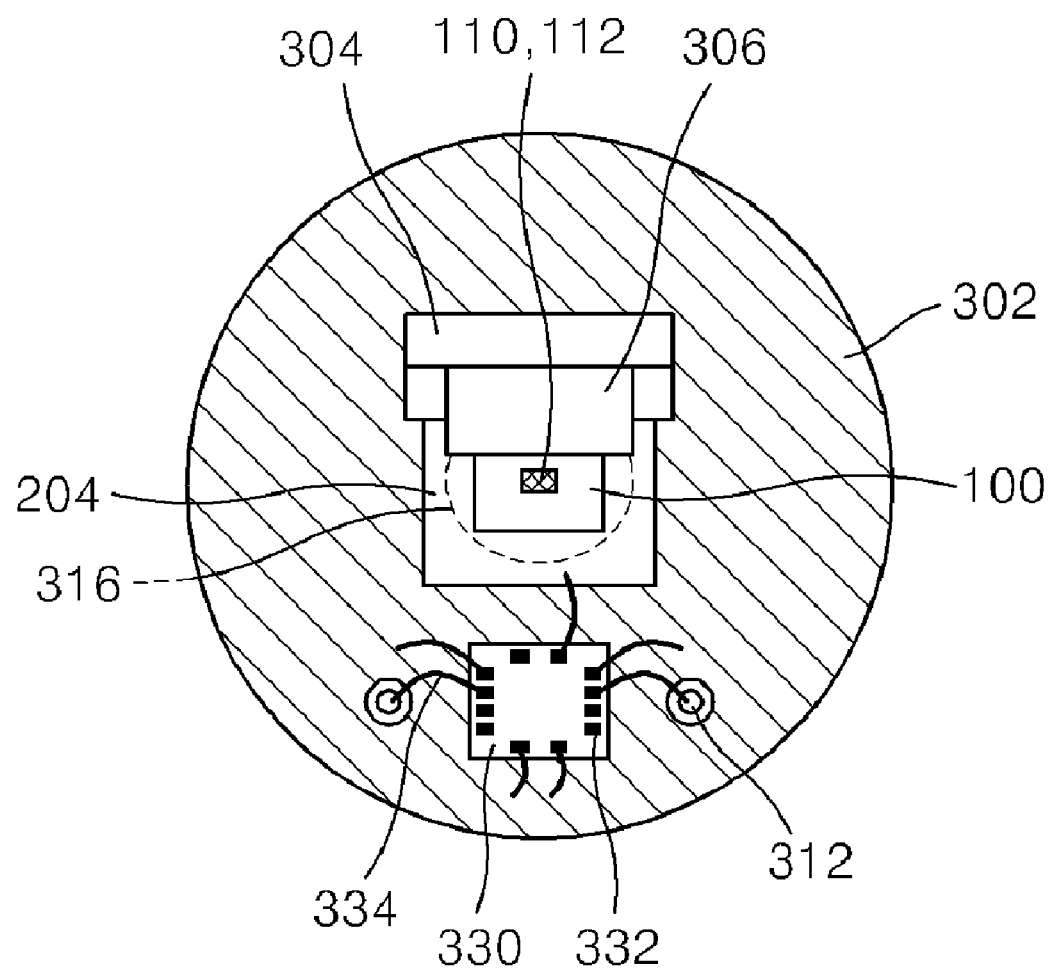

FIGS. 10 and 11 are front and side cross-sectional views of a bi-directional optical module according an embodiment of the present invention, and FIGS. 12 and 13 are plan views of the bi-directional optical module.

The same reference numerals of FIGS. 10 through 13 as those of FIGS. 6A and 6B denote like elements. For convenience, a BPF of a reception optical element is omitted in FIGS. 10 and 11. A bi-directional optical module 300 is formed of a TO type package including a transmission optical element 100 into which an LD 102 used for transmission, a monitor PD 104 monitoring light output from the LD 102, and an SOA 106 and a reception optical element 200 including an optical BPF 202 transmitting only light having a wavelength of 1.5 μm and a PD 204 receiving light.

In the bi-directional optical module 300, an optical axis of the LD 102 is perpendicular to a light receiving surface 316 of the PD 204 so as to simultaneously transmit and receive optical signals having different wavelengths. In the bi-directional optical module according to the present invention, a TO type LD module and a TO type PD module do not need to be separately manufactured. A smaller number of parts needing to be precisely processed are used. Thus, manufacturing cost can be reduced.

A structure of a TO type package and a method of assembling an optical element will now be described with reference to FIGS. 10 through 13.

In the TO type package, a sub-mount pedestal 304 and a sub-mount 306 are perpendicularly attached to a circular header base 302. The circular header base 302 encloses a cylindrical cap 308, a window 310 through which light passes is formed in the center of the cylindrical cap 308. A lead pin 312 protruding toward the outside is attached to the circular header base 302. For convenience, wires bonded to the lead pin 312 inside the cylindrical cap 308 are omitted in FIGS. 10 and 11.

A method of assembling an optical element in a TO type package will now be described.

The PD 204 attached to the BPF 202 is attached to the circular header base 302. The transmission optical element 100 into which the LD 102, the monitor PD 104, and the SOA 106 are integrated is attached to the sub-mount 306 and then to the sub-mount pedestal 304 having a step 314. The step 314 formed in the sub-mount pedestal 304 is used to prevent the transmission optical element 100 into which the LD 102, the monitor PD 104, and the SOA 106 are integrated and the PD 204 from clashing against each other and thus being damaged during works due to a very narrow gap therebetween. As a result, the optical axis of the LD 102 is perpendicular to the light receiving surface 316 of the PD 204 so as to simultaneously transmit and receive optical signals having different wavelengths.

An alignment of first and second active layers (waveguides of an LD and an SOA) with the light receiving surface 316 of the PD 204 is important to obtain high module responsivity during attaching of the transmission optical element 100 to the sub-mount pedestal 304. However, the light receiving surface 316 of the PD 204 is wide, and thus an alignment tolerance of about 20 μm can be obtained as described above. In a case where, the sub-mount pedestal 304 and the circular header base 302 are manufactured using precise machining and a die bonding process, the sub-mount pedestal 304 and the circular header base 302 can be easily assembled within the alignment tolerance. In addition, slight optical loss caused by the alignment tolerance is compensated by amplifying an optical signal having a wavelength of 1.5 μm using the SOA 106.

A trans-impedance amplifier 330 may be mounted inside the TO type package as shown in FIG. 13 to improve an electric crosstalk. The trans-impedance amplifier 330 is mounted on the circular header base 302 in a die form, and a wire bonding pad 332 is connected to the lead pin 312 of the TO type package by bonding wires 334.

As described above, a bi-directional optical module can be easily manufactured using a smaller number of required parts, and the price of the bi-directional optical module can be lowered.

Also, an optical signal having a wavelength of 1.5 μm can be amplified by an SOA to compensate for coupling loss with an optical fiber, waveguide loss, and coupling loss with a PD so as to increase an alignment tolerance and sensitivity of a reception optical element.

In addition, a spontaneous emission of the SOA can be intercepted using an optical BPF so as to increase the sensitivity of the reception optical element and prevent an optical crosstalk caused by an operation of an LD in a wavelength of 1.3 μm.

Moreover, a forward voltage can be applied to the LD and the SOA, and a ground voltage can be applied to a monitor PD. Thus, one power supply is required. Also, the PD can be separated at a high transmission speed so as to reduce an effect of an electric crosstalk.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A bi-directional optical module simultaneously transmitting and receiving optical signals having different wavelengths, comprising:
    a single TO (transistor outline) type package;
    a first optical element including an LD (laser diode) and an SOA (semiconductor optical amplifier) which are aligned on an optical axis of the LD, integrally formed each other on a substrate, the SOA amplifying optical signals which the bi-directional optical module has received from an outside via the LD; and
    a second optical element including a PD (photodiode) receiving the optical signals amplified by the SOA of first optical element and having a light receiving surface perpendicular to the optical axis of the LD of the first optical element, wherein both of the first optical element and the second optical element are disposed inside the single TO type package.

2. The bi-directional optical module of claim 1, further comprising a monitor PD integrally formed and aligned on the optical axis of the LD formed on the substrate.

3. The bi-directional optical module of claim 1, wherein the PD of the second optical element is a surface incidence type PD.

4. The bi-directional optical module of claim 1, wherein an optical BPF (band pass filter) is formed on a light receiving surface of the surface incidence type PD.

5. The bi-directional optical module of claim 1, wherein the first optical element further includes a monitor PD, which is optically coupled to the optical axis of the LD of the first optical element through a free space propagation or a lens.

6. The bi-directional optical module of claim 1, wherein the single TO (transistor outline) type package includes a cap, a header base, a sub-mount pedestal and a sub-mount,
wherein the sub-mount pedestal and the sub-mount are perpendicularly attached to the header base, and the header base encloses the cap.

7. The bi-directional optical module of claim 6, wherein the PD of the second optical element is attached to the header base of the single TO type package, and the first optical element is attached to the sub-mount of the single TO type package.

8. The bi-directional optical module of claim 1, wherein the SOA is disposed between the LD of the first optical element and the PD of the second optical element.

9. The bi-directional optical module of claim 1, wherein:
the LD outputs a first optical signal with a first wavelength to the outside, and a portion of the first optical signal outputted from the LD is absorbed by the SOA; and
the SOA receives a second optical signal with a second wavelength from the outside via the LD, and then amplifies the received second optical signal.

10. A bi-directional optical module simultaneously transmitting and receiving optical signals having different wavelengths, comprising:
a single TO (transistor outline) type package;
a first optical element including an LD, a monitor PD and an SOA which are aligned on an optical axis of the LD, integrally formed each other on a substrate, the SOA amplifying optical signals which the bi-directional optical module has received from an outside via the LD; and
a second optical element including a PD receiving the optical signals amplified by the SOA of the first optical element and having a light receiving surface perpendicular to the optical axis of the LD of the first optical element and an optical BPF attached to the light receiving surface of the PD,
wherein both of the first optical element and the second optical element are disposed inside the single TO type package.

11. The bi-directional optical module of claim 10, wherein the PD of the second optical element is a surface incidence type PD.

12. The bi-directional optical module of claim 10, wherein the monitor PD is optically coupled to the optical axis of the LD of the first optical element through a free space propagation or a lens.

13. The bi-directional optical module of claim 10, wherein the SOA is disposed between the LD of the first optical element and the PD of the second optical element.

14. The bi-directional optical module of claim 10, wherein:
the LD outputs a first optical signal with a first wavelength to the outside, and a portion of the first optical signal outputted from the LD is absorbed by the monitor PD, and a further portion of the first optical signal outputted from the LD is absorbed by the SOA; and
the SOA receives a second optical signal with a second wavelength from the outside via the LD and the monitor PD, and then amplifies the received second optical signal.

15. A bi-direction optical module simultaneously transmitting and receiving optical signals having different wavelengths comprising:
a single TO (transistor outline) type package;
a first optical element attached to a sub-mount of the TO type package and including a sub-mount pedestal perpendicularly attached to a header base and the sub-mounted positioned inside the sub-mount pedestal;
a second optical element attached to the header base of the TO type package and including a reception surface perpendicular to an optical axis of the first optical element,
wherein both of the first optical element and the second optical element are disposed inside the single TO type package; and,
wherein the first optical element comprises an LD (laser diode) and an SOA (semiconductor optical amplifier) which is aligned on an optical axis of the LD, integrally formed each other on a substrate.

16. The bi-directional optical module of claim 15, wherein the first optical element further comprises a monitor PD integrally formed and aligned on the optical axis.

17. The bi-directional optical module of claim 15, wherein the second optical element comprises a surface incidence type PD having a light receiving surface on which an optical BPF is formed.

18. The bi-directional optical module of claim 15, wherein a trans-impedance amplifier is mounted in the TO type package to improve an electric crosstalk.

* * * * *